LOW FREQUENCY OSCILLATOR CONTROLLED BY THE DIFFERENCE FREQUENCY OF TWO CRYSTALS

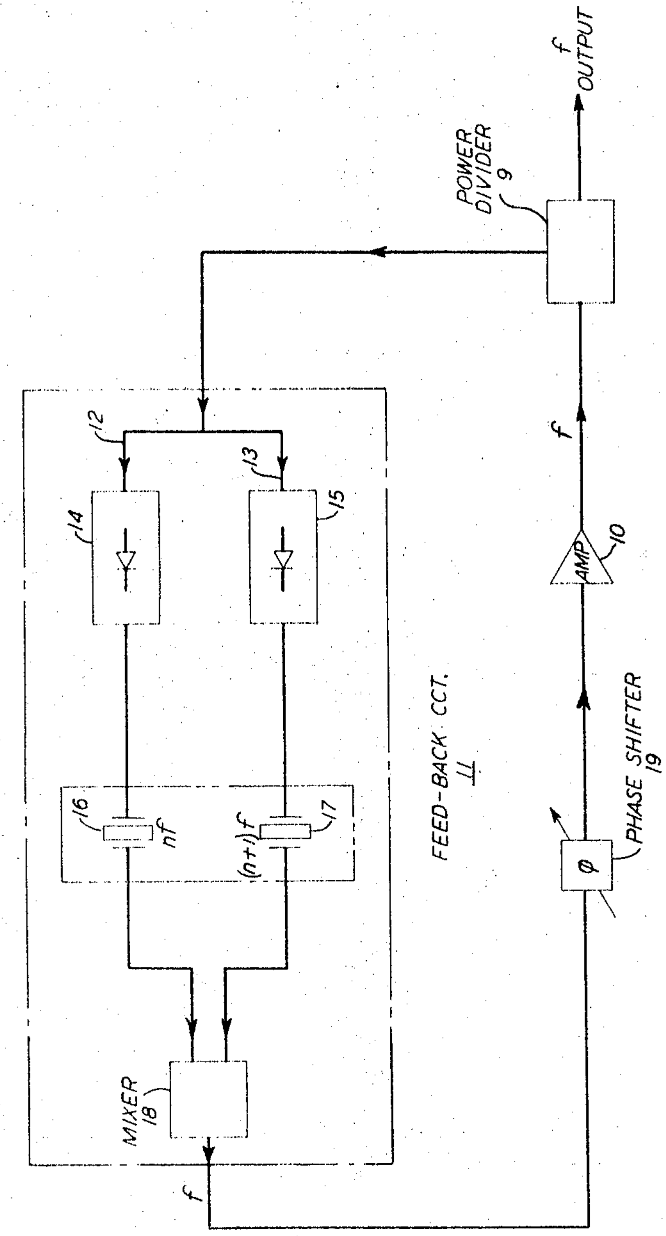
INVENTOR
H. SEIDEL
BY
Lyman Sherman
ATTORNEY 3,462,703

Harold Seidel, Warren Township, Somerset County, N.J., assignor to Bell Telephone Laboratories, Incorporated, Murray Hill, N.J., a corporation of New York Filed Dec. 14, 1967, Ser. No. 690,507
Int. Cl. H03b *21/00*
U.S. Cl. 331—37 3 Claims

ABSTRACT OF THE DISCLOSURE

A portion of the output signal of an amplifier is used to generate harmonics of a signal frequency. From among these harmonics, two adjacent harmonics are extracted by means of two crystal filters and coupled to a mixer. The latter, tuned to the difference frequency, produces a signal at the signal frequency which is fed back in phase to the input of the amplifier to sustain oscillations.

This invention relates to low-frequency, crystal-controlled oscillators.

Background of the invention

The stabilizing effect of a piezoelectric crystal on an electronic oscillator is well known. It is equally well known that the size of a crystal increases as the frequency decreases and that at low frequencies, such as the audio frequency range, crystal sizes become prohibitive for all practical purposes.

Various arrangements, typified by United States Patents 1,866,267, 2,448,188 and 2,859,346, have been devised to avoid the size problem. In each of these patents, the outputs from two crystal-controlled, high frequency oscillators are mixed together to produce a low, difference frequency signal. It is apparent that by the suitable selection of the high frequencies, difference frequencies in the audio range can be obtained.

The difficulty typically encountered in such arrangements is that there is no feed-back between the low frequency output signal, and the individual high frequency oscillators. As a consequence, there are no means provided whereby changes in the output frequency are recognized and communicated to the high frequency oscillators for corrective purposes. Clearly such an arrangement is necessary since relatively small changes at the high frequencies are magnified at the lower, difference frequency.

Summary of the invention

In accordance with the present invention, the high frequency crystals are used as filters in the feed-back path of a low frequency oscillator. In the illu,strative embodiment described, the fed-back component of the oscillator output signal is divided into two portions and coupled, respectively, to two parallel signal paths. Each path includes a nonlinear element to generate harmonics of the signal frequency, and a crystal filter tuned to one of these harmonics. By selecting adjacent harmonics for the two crystals, their frequency difference is then equal to the signal frequency. Accordingly, the adjacent harmonic signal components passed by the two crystal filters are coupled to a mixer wherein a difference frequency, equal to the signal frequency, is generated. This difference frequency signal is fed back in proper phase to sustain oscillations.

It is an advantage of the invention that changes in the resonant frequency of the crystals, which are reflected on a cycle-by-cycle basis in the output frequency of prior art beat-type low frequency crystal-controlled oscillators, are reduced in the present arrangement by a factor equal to the harmonic to which the crystal filters are tuned. As a result, the frequency stability of a low frequency crystal-controlled oscillator, in accordance with the invention, is comparable to the frequency stability of a typical high frequency crystal oscillator and orders of magnitude better than that of the above-cited prior art oscillators.

These and other objects and advantages, the nature of the present invention, and its various features, will appear more fully upon consideration of the illustrative embodiment now to be described in detail in connection with the accompanying drawing.

Brief description of the drawing

The single figure of the drawing shows the crystal-controlled low frequency oscillator of the invention.

Detailed description

In the figure there is shown, in block diagram, an embodiment of a crystal-controlled oscillator in accordance with the invention including an amplifier 10 and a feed-back circuit 11. The latter comprises parallel signal paths 12 and 13, each of which includes a nonlinear element 14, 15 and a crystal filter 16, 17. The output from each filter is coupled to a mixer 18 tuned to the oscillator frequency $f$. The mixer signal is, in turn, coupled to the input end of the amplifier in proper phase to sustain oscillations at frequency $f$. Means, such as an adjustable phase shifter 19, are advantageously included in the feed-back path to facilitate adjustment of the phase of the fed-back signal.

In operation, a portion of the oscillator output signal having a frequency $f$ is coupled, by means of a power divider 9, into feed-back circuit 11 wherein it is divided into two components. One component is coupled into wavepath 12 and nonlinear element 14. The other component is coupled into wavepath 13 and nonlinear element 15. The nonlinear elements, depicted as diodes in the figure, generate harmonics of the signal frequency. Of these harmonics only the $n^{th}$ harmonic is passed by crystal filter 16 and only the $(n+1)^{th}$ harmonic is passed by crystal 17. These two adjacent harmonic components are then coupled to mixer 18 wherein a difference signal at frequency $f$ is produced. This signal component is then coupled to the input end of amplifier 10. Means such as phase shifter 19 are used to adjust the phase of the feed-back signal to sustain oscillations at frequency $f$ in accordance with well-established principles.

As indicated above, the frequency selectivity of an oscillator in accordance with the present invention greatly exceeds the frequency stability of a low frequency oscillator obtained by beating together two independent high frequency oscillators. In this latter arrangement, changes in frequency of $f_1$ and $f_2$ in the respective oscillators produce a net change in the low frequency output signal equal to $f_1+f_2$. For example, a pair of one megacycle crystal oscillators having frequency stabilities of the order of $10^{-6}$ cycles per second, will cause a frequency indeterminacy in the low frequency output signal of $\pm 2$ cycles per second. By contrast, the same instability in the same crystals when used as harmonic filters in an oscillator in accordance with the presen invenion will cause a frequency indeterminacy in the low frequency output signal of only $$\frac{1}{n}+\frac{1}{n+1}\approx \pm\frac{2}{n}$$

cycles per second.

In all cases it is understood that the above-described arrangement is illustrative of but one of the many possible specific embodiments which can represent applications of the principles of the invention. For example, in the illustrative embodiment described, the fed-back signal is first divided into two components, and harmonics of the signal frequency are separately induced by means of two different nonlinear elements. Alternatively, harmonic components can be generated by means of a single nonlinear element and the resulting harmonic components then divided and the two portions coupled, respectively, to each of the two crystal filters. Thus, numerous and varied other arrangements can readily be devised in accordance with these principles by those skilled in the art without departing from the spirit and scope of the invention.

I claim:

1. A crystal-controlled oscillator comprising:
an amplifier;
and a feed-back circuit for coupling a portion of the output signal from said amplifier into the input of said amplifier;
said circuit comprising:
first and second parallel paths, each of which includes a nonlinear element, and a crystal filter;
the first of said filters being tuned to the $n^{th}$ harmonic of the signal coupled into said first path;
the second of said filters being tuned to the $(n+1)^{th}$ harmonic of the signal coupled into said second path;
a mixer for combining said harmonics to produce a difference frequency signal;
means for coupling said difference frequency signal into said amplifier in proper phase to sustain oscillations at said difference frequency;

and means for extracting wave energy at said difference frequency from said oscillator.

2. The oscillator according to claim 1 wherein;
said difference frequency is within the audio frequency range.

3. A crystal-controlled oscillator for generating wave energy at a frequency $f$ comprising:
means for amplifying wave energy at said frequency;
means coupled to the output of said oscillator for generating harmonics of said signal frequency;
means, comprising crystal filters, for extracting a pair of adjacent harmonics $nf$ and $(n+1)f$, where $n$ is an integer;
means for mixing said adjacent harmonics and producing a difference frequency signal at said signal frequency $f$;
and means for feeding said difference frequency signal back to the input of said amplifier in phase to sustain oscillations.

References Cited

UNITED STATES PATENTS

| | | | |
|---|---|---|---|
| 1,717,451 | 6/1929 | Hund | 331—37 |
| 2,448,188 | 8/1948 | Morrison | 331—37 |

ROY LAKE, Primary Examiner

S. H. GRIMM, Assistant Examiner

U.S. Cl. X.R.

331—76, 162